United States Patent [19]
McKinnon et al.

[11] Patent Number: 5,072,183
[45] Date of Patent: Dec. 10, 1991

[54] RF GENERATOR FOR MAGNETIC RESONANCE IMAGING APPARATUS

[75] Inventors: Graeme McKinnon, Zurich, Switzerland; Roland Proksa, Hamburg, Fed. Rep. of Germany

[73] Assignee: U.S. Philips Corp., New York, N.Y.

[21] Appl. No.: 590,444

[22] Filed: Sep. 26, 1990

Related U.S. Application Data

[63] Continuation of Ser. No. 392,170, Aug. 10, 1989, abandoned.

[30] Foreign Application Priority Data

Aug. 30, 1988 [DE] Fed. Rep. of Germany ....... 3829374

[51] Int. Cl.$^5$ ............................................. G01R 33/20
[52] U.S. Cl. ..................................... 324/314; 324/307
[58] Field of Search ............... 324/300, 303, 309, 310, 324/311, 312, 313, 314, 318, 322, 307; 128/653

[56] References Cited

U.S. PATENT DOCUMENTS

| | | | |
|---|---|---|---|
| 3,581,191 | 5/1971 | Anderson | 324/310 |
| 3,681,680 | 8/1972 | Ernst | 324/310 |
| 3,786,341 | 1/1974 | Anderson | 324/311 |
| 3,909,705 | 9/1975 | Tschopp | 324/307 |
| 3,968,424 | 7/1976 | Ernst | 324/312 |
| 4,327,327 | 4/1982 | Greenwood et al. | 324/304 |
| 4,656,424 | 4/1987 | Tsur et al. | 324/309 |
| 4,682,106 | 7/1987 | Vatis et al. | 324/307 |
| 4,694,254 | 9/1987 | Vatis et al. | 324/309 |

Primary Examiner—Michael J. Tokar
Attorney, Agent, or Firm—Jack D. Slobod

[57] ABSTRACT

An rf generator for magnetic resonance imaging apparatus including a modulator in which a carrier is modulated with an envelope signal, and a transmitter stage which is connected subsequent to the modulator generator in which the implementation of the modulating signal enables the expenditure for the transmitter stage be substantially reduced in that the modulator comprises a first modulator section in which the envelope signal is converted into a series of equally long digital pulses whose density corresponds to the amplitude of the envelope signal, in the k different kinds of pulses are provided, in that during each pulse of a given kind the carrier is always switched on with a given phase position which deviates from the phase positions of the carrier which are associated with the pulses of the other kinds by 360°/k or an integer multiple thereof, and in that the resultant pulse-wise switched, preferably square-wave carrier acts as a switching signal for the transmitter stage.

19 Claims, 3 Drawing Sheets

RF GENERATOR FOR MAGNETIC RESONANCE IMAGING APPARATUS

This is a continuation of application Ser. No. 392,170, filed Aug. 10, 1989, now abandoned.

BACKGROUND OF THE INVENTION

The invention relates to an rf generator for magnetic resonance imaging apparatus, comprising a modulator in which a carrier is modulated with an envelope signal, and also comprising a transmitter stage which is connected subsequent to the modulator.

An rf generator of this kind is known from DE-OS 36 05 547 corresponding to the commonly owned U.S. Pat. No. 4,843,549. Therein, the envelope signal is amplitude modulated on the carrier. The subsequent transmitter stage serves as a linear amplifier for the amplitude modulated carrier. The same holds good for the rf generator described in the earlier European application 88 200 981 which corresponds to commonly owned U.S. Pat. No. 4,879,514. Therein, the modulator has a digital construction but the amplifier is coupled thereto via a digital-to-analog converter. Amplifiers of this kind must deliver an output power of from a few hundred W to some kW. The modulated carrier frequency then amounts to from 5 MHz to approximately 200 MHz, depending on the strength of the magnetic field of the magnetic resonance imaging apparatus in which the rf generator is used. Such amplifiers are expensive.

SUMMARY OF THE INVENTION

It is an object of the present invention to construct an rf generator of the kind set forth so that the transmitter stage can be simplified.

This object is achieved in accordance with the invention in that the modulator comprises a first modulator section in which the envelope signal is converted into a series of equally long digital pulses whose value is determined by the envelope signal and whose density corresponds to the amplitude of the envelope signal, in that the first modulator section controls a second modulator section so that the transmitter stage operating in the switching mode supplies carrier oscillations only during the pulses, the phase of said carrier oscillation being determined by the value of the pulse. Thus, in accordance with the invention instead of varying the amplitude of the carrier signal applied to the transmitter stage in accordance with the envelope signal, the density and the phase of the oscillations are varied as a function of the carrier frequency. Each oscillation drives the transmitter stage so that it operates in the switching mode, so that on the one hand the requirements imposed as regards the linearity of the transmitter stage are less severe while on the other hand the loss power which is converted into heat in the transmitter stage is also reduced. Such a transmitter stage in which moderate requirements only are imposed as regards the linearity and in which the loss power is lower can be constructed using comparatively simple means. The power is varied by varying the distance in time between the individual carrier oscillations.

The phase of the carrier oscillation processed by the transmitter stage is determined by the digital value of the pulse. When the pulse can assume two digital values only, i.e. either a positive value or a negative value, the polarity of each pulse is determined by the polarity of the envelope signal at the relevant instant, the carrier oscillation being applied to the transmitter stage with a first phase during pulses having one polarity, and being applied thereto with the opposite phase during pulses having the opposite polarity. It would in principle also be possible to assign more than two different digital values to the pulses, for example four values. This could be useful if the envelope signal were complex, i.e. given with a real and an imaginary component. The expenditure for the modulator, however, is then substantially greater.

Generally, the pulses may occur asynchronously with respect to the carrier oscillation. The realisation of a modulator operating on this basis, however, poses substantial difficulty. An essentially simpler construction is obtained in a further embodiment in accordance with the invention in that the carrier performs one or more complete oscillations within the shortest possible distance T between two pulses, and in that the distance between two successive pulses is mT, where m is a positive integer. As a result, the pulses are switched off each time in the same position in time in relation to the carrier oscillation, preferably upon their passage through zero, thus substantially facilitating the processing. In such a case, however, continuous variation of the pulse density or the distance in time between two pulses is no longer possible. It can be performed only in discrete steps amounting to T. In order to achieve an adequate dynamic range, the period of time T must be very short in comparison with the duration of the envelope signal, for example 1/1000 thereof or less.

In a transmitter stage comprising a linearly operating output amplifier the output power of the amplifier is substantially independent of its supply voltage between given limits, but in a switching amplifier the output power strongly varies as the supply voltage varies. This dependency on the supply voltage could be avoided by using a stabilised supply voltage generator. Such a generator should be designed for several hundred W or some kW and would thus be very expensive.

Therefore, in a further version of the invention the transmitter stage is connected to a non-stabilised supply voltage, there being provided an analog-to-digital converter which digitises a signal which is proportional to the supply voltage, the first modulator section comprising an accumulator circuit for forming a control signal which depends on the integral of the difference between the pulses and the envelope signal, the control signal being applied to a logic circuit which generates a pulse of one kind or the other so that the integral remains within a given range. Thus, a non-stabilised supply voltage is accepted and the fluctuation of the output power relating to the fluctuating supply voltage is compensated for in that the envelope signal is varied in an inversely proportional manner with respect to the supply voltage. The energy contained in a single carrier oscillation then fluctuates as the supply voltage fluctuates, but the output power remains constant in that the envelope signal, and hence the pulse density, is varied in an inversely proportional manner with respect to the supply voltage.

BRIEF DESCRIPTION OF THE DRAWING

The invention will be described in detail hereinafter with reference to the drawing. Therein.

DETAILED DESCRIPTION OF THE PREFERRED EMBODIMENTS

Figure 1:
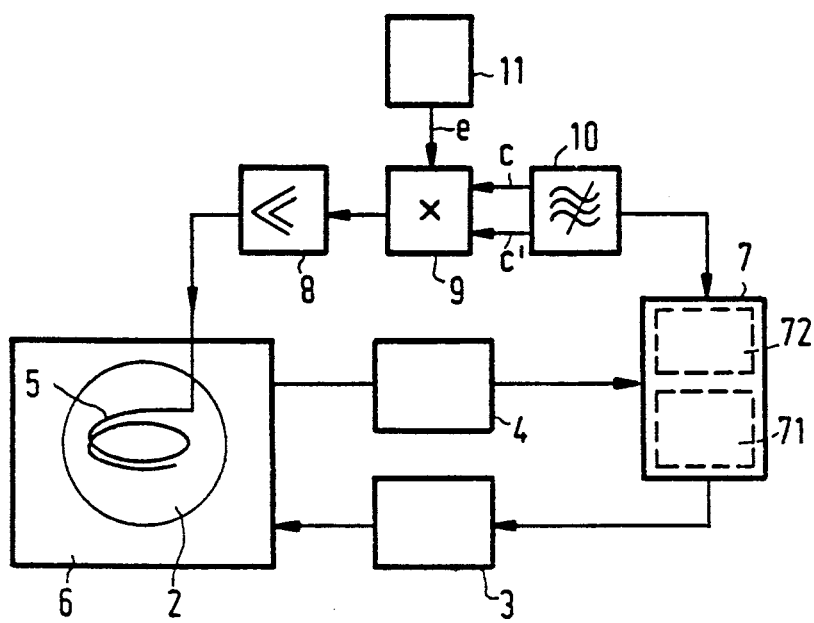
FIG. 1 shows a block diagram of a magnetic resonance imaging apparatus in accordance with the invention in which the invention can be used.

The reference numeral 6 in FIG. 1 denotes a device which comprises a magnet which generates a uniform, steady magnetic field which extends perpendicularly to the plane of drawing in an examination zone 2. The magnetic flux density thereof may amount to from some tenths of a Tesla to some Tesla. In addition, if necessary magnetic gradient fields are also generated, i.e. magnetic fields which extend in the same direction as the steady, uniform magnetic field but whose strength varies linearly in the direction of the magnetic field or in a direction perpendicular thereto. To this end, the device 6 is coupled to a generator 3 which supplies the currents for the magnetic gradient fields. There is also provided an rf coil 5 which generates an rf magnetic field perpendicularly to the steady magnetic field and which is connected to the output of a transmitter section. The frequency of the rf magnetic field corresponds to the Larmor frequency which, is known to be proportional to the magnetic flux density of the uniform, steady magnetic field; for a flux density of, for example 0.2 T it amounts to approximately 8.5 MHz. The transmitter section comprises an amplifier 8 which is connected to the output of a modulator 9 in which a carrier having the Larmor frequency and being generated by an oscillator 10 in two phase positions (c and c') which have been shifted 180° with respect to one another is modulated with an envelope signal e which is stored as a series of digital data words in a memory 11.

The spin resonance signals generated in the examination zone 2 are detected by the rf coil or another rf coil and are converted to the low frequency range and digitised in a receiver 4.

Control is provided by a digital central unit 7 which comprises a control section 71 for this purpose. The digital central unit also comprises a processing section 72 which processes the data supplied by the receiver 4 and which reconstructs the nuclear magnetisation distribution in the examination zone 2 therefrom.

Figure 2:
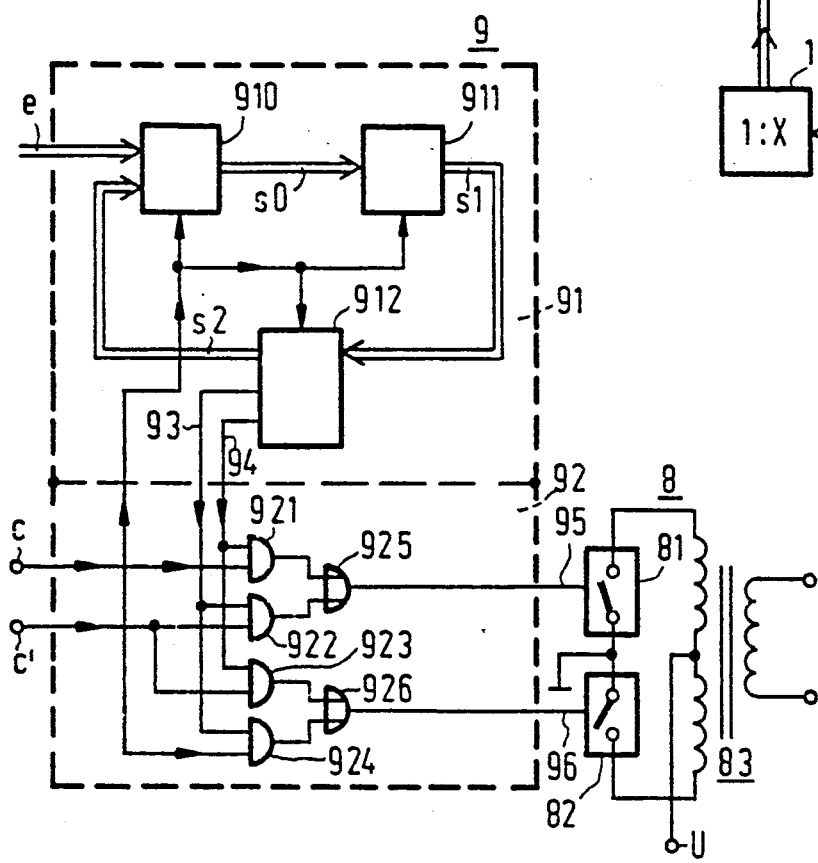
FIG. 2 shows a block diagram of an rf generator in accordance with the invention.

FIG. 2 shows a block diagram of the modulator 9 and the amplifier 8 which form the so-called transmitter stage. The modulator 9 consists of two modulator sections 91 and 92. In the first modulator section 91 the envelope signal e which is derived from the memory 11 which has a word width of, for example 16 bits, is converted into a series p of equally large and equally long pulses of a first or a second kind, depending on the polarity of the envelope signal e, the density thereof corresponds to the amplitude of the digital envelope signal and is preferably proportional thereto. Therefore, this first section is also referred to hereinafter as the pulse density modulator.

In the second section 92 of the modulator the carrier signals c, c' are supplied by the oscillator 10 (FIG. 1) and bring in phase opposition are modulated by the pulse density modulated signals. This modulation consists in that, depending on the value of the digital pulse generated by the pulse density modulator, either one of the two carrier signals or none of these two carrier signals is applied to the pushpull output of this modulator section for supply to the input of the transmitter stage 8.

Figure 3A:
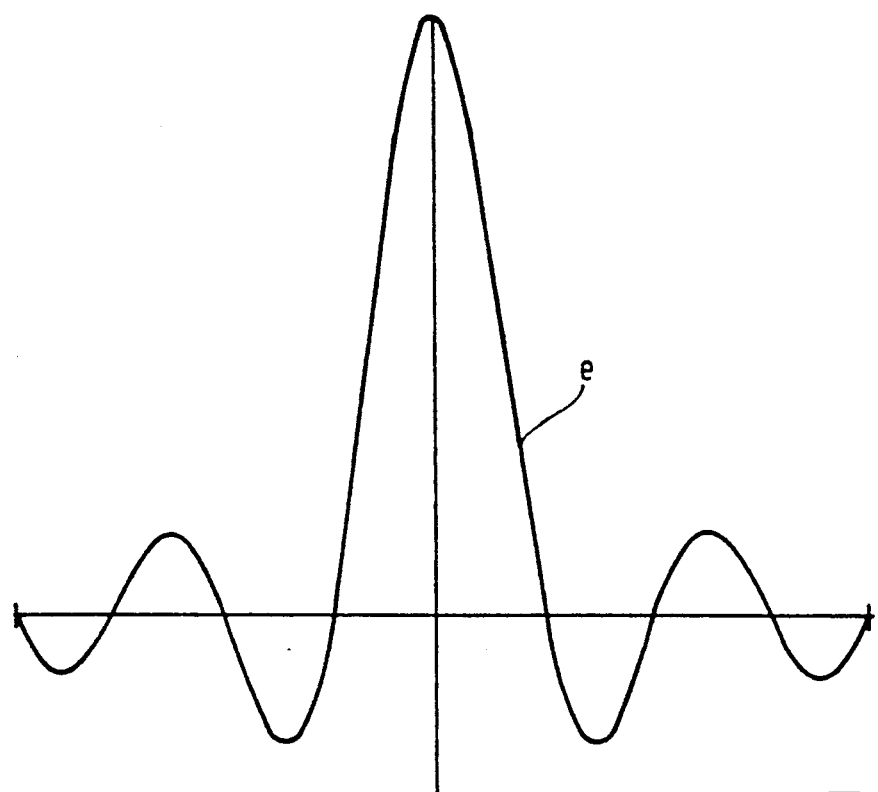
FIG. 3a shows the variation in time of the envelope signal and FIG. 3b shows the corresponding pulse density modulated signal in the case of an rf pulse.

FIG. 3a shows the variation of the envelope signal for a typical rf pulse for use in a magnetic resonance imaging apparatus as shown in FIG. 1 for the excitation of the nuclear magnetisation in a given slice of the examination zone. An "rf pulse" is to be understood to mean herein an rf signal which may comprise many thousands of periods of the carrier oscillation, while "pulse" is to be understood to mean a signal which comprises only one or a few oscillations of the carrier. Despite the analog representation, a digital signal is actually concerned.

Figure 3B:
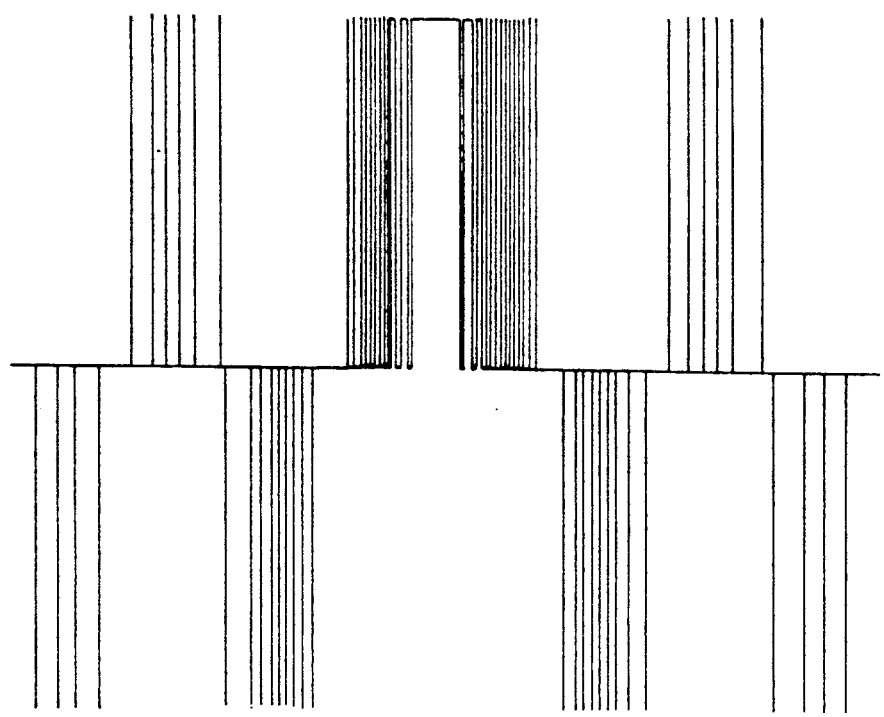

FIG. 3b similarly shows the corresponding pulse density modulated signal, a positive polarity being assigned to the pulses having one digital value whilst the pulses having the other value are assigned a negative polarity. The pulses have the same amplitude and the same duration. It appears from the central part that the pulse density may become so high that the pulses adjoin one another without spacing.

The pulse density modulation could be performed so that the variation in time of the pulse density modulated signal p would be calculated from the amplitude variation of the envelope signal e, i.e. so that with each amplitude there is associated a distance between two successive pulses which is proportional thereto, expressed in multiples of a period of time T which can cover one or more complete oscillations of the carrier signal. The polarity of the rf pulse p should be chosen in accordance with the polarity of the envelope signal e. On the one hand such a method would be comparatively inaccurate because only the instantaneous values of the envelope signal would be taken into account, and on the other hand it could be realised only at comparatively great expenditure. The accurate and comparatively simple pulse density modulator 91 shown in FIG. 2 is based on the idea to form the time integral over the envelope signal e and over the pulse density modulated signal p and to decide in dependence of the difference between the integrals (or the integral of the difference) whether a pulse is to be generated (when a given range of values is not reached or exceeded) and which polarity the pulse must have for the said integral over the difference to become as small as possible.

To achieve this, the pulse density modulator comprises a digital adder 910 whose output is connected to a register 911 whose output signal is applied to a PAL logic stage 912 (PAL=Programmable Array Logic). This logic stage can generate equally large digital pulses of different polarity on an output which is connected to an input of the adder 910 and on another output supplies, simultaneously with the pulses, modulator signals which are derived therefrom and which serve for the second modulator section 92. The envelope signal e is applied to a second input of the adder 910. The three stages 910, 911 and 912 receive a clock signal having the carrier frequency. Instead, however, use could be made of a clock signal whose frequency is two times, three times or even four times lower than the frequency of the carrier; such a clock signal, however, must be synchronised with the carrier. The lower clock frequency, the simpler it will be to realise the pulse density modulator and the more inaccurate, however, the pulse density modulation will be. The choice of the clock frequency, therefore, is a compromise between expenditure and accuracy. In the case of magnetic resonance imaging apparatus involving low magnetic flux densities and hence a low carrier frequency, the clock frequency will be chosen to equal the carrier frequency as in the example in accordance with the invention.

In the following description of the pulse density modulator 91 lower-case letters denote the instantaneous value of a digital signal and capital letters denote the integral over a signal from the first clock pulse until a given instant. This instant is characterized by the index added to the relevant letter. For example, $e_n$ denotes the value of the digital envelope signal e after clock pulses.

Hereinafter the pulse density modulator will be considered after n+1 clock pulses. The output signal s0 of the adder 910 then satisfies the equation:

$$s0 = e_{n+1} + F_n \tag{1}$$

For $F_n$:

$$F_n = E_n - P_n \tag{2}$$

$F_n$ thus corresponds to the integral over the difference between E and P or the sum of these differences after n clock pulses. This signal will be referred hereinafter as the error sum signal. The output signal s1 has been delayed by one clock pulse period with respect to the signal s0. Thus:

$$s1 = e_n + F_{n-1} \tag{3}$$

In the logic component it is decided on the one hand whether a pulse is to be generated in the clock period n+1; on the other hand, the stored signal s1 is reduced by the value of the signal p during the preceding clock period n; this value may also be zero. Thus, the following holds good for the signal s2 applied to the second input of the adder 910:

$$s2 = s1 - p_n \tag{4}$$

When the equation (3) is inserted into the equation (4), the following is obtained:

$$s2 = e_n - p_n + F_{n-1} \tag{5}$$

Taking into account that $e_n$ and $p_n$ represent the difference and the error signal, respectively, for the clock period n, it appears that s2 corresponds to the error sum signal for the $n^{th}$ clock period. Therefore, $$s2 = F_n \tag{6}$$

In the logic component 912 the signal $p_{n+1}$ is also determined in dependence of the output signal s1. When the amount of the maximum value that can be assumed by the envelope signal e is denoted as a, p is equated to a when s1 is larger than $+a/2$. However, if s1 is smaller than $-a/2$, p is equated to $-a$. Finally, if s1 is not smaller than $-a/2$ and not larger than $+a/2$, p is equated to 0. When the digital value of a/2 can be represented by an integer power of 2, the logic stage 912 need only process the most-significant bits of the signal s1; the other bits may be applied directly to the adder 910. The construction of the logic stage 912 is thus substantially simplified.

The second modulator section is controlled via the outputs 93 and 94 in dependence of the variation of the signal p.

The output 93 is connected to one input each of two AND-gates 922 and 924, the other inputs of which receive the carrier c and c', respectively. Similarly, the output 94 is connected to an input of two AND-gates 921, 923. The outputs of the AND-gates 921 and 922 are connected to the inputs of an OR-gate 925 and similarly the outputs of the AND-gate 923, 924 are connected to the inputs of an OR-gate 926. The outputs 95 and 96 of the OR-gate 925 and 926 form the (pushpull) outputs of the modulator section 92.

The two pushpull output signals of the circuits 925 and 926 are applied to the transmitter stage 8, i.e. to the control inputs of two switches 81 and 82 which are included therein, and which are thus opened and closed in a pushpull manner. The connection node of the two switches which can be realised by way of suitable power MOS transistors, is grounded. The connections of the switches 81 and 82 which are remote from the connection node are connected to one another via the primary winding of a transformer 83, the secondary windings of which produce a signal b(t) which is applied to the rf coil 5 (FIG. 1) which is not shown in FIG. 2. The primary winding of the transformer 83 comprises a central tapping which is connected to a supply voltage.

In the case of a positive pulse (p= +a) the signal at the output 93 is logic "0" and that at the output 94 is logic "1". Consequently, the signal c (third line) which is "1" during the first half of a pulse reaches the switch 81, via the AND gate 921, the OR gate 925 and the output 95, for as long as p is positive (="1"). Similarly, the signal c' (fourth line) reaches the switch 82 during the second half of a pulse. Thus, during the first half of a positive pulse the switch 81 is opened whilst the switch 82 is opened during the second half of a positive pulse. This is repeated in the time intervals t4–t5 and t7–t8.

During the intervals t3–t4 and t6–t7 no pulse is generated (p=0) and the signals on the outputs 93 and 94 are "0". Thus, all AND-gates are blocked during these intervals so that the transmitter stage does not receive an input signal.

In the interval t7–t8 a positive pulse is succeeded immediately by a negative pulse (p= −a). During this pulse and during all other negative pulses, the signal on the output 93 is "1" and that on the output 94 is "0". Consequently, the signal c reaches the output 96 and the signal c' reaches the output 95 for as long as p is negative. Thus, in the case of a negative pulse first the switch 82 is opened and subsequently the switch 81, which is contrary to the events occurring in the case of a positive pulse.

Figure 4:
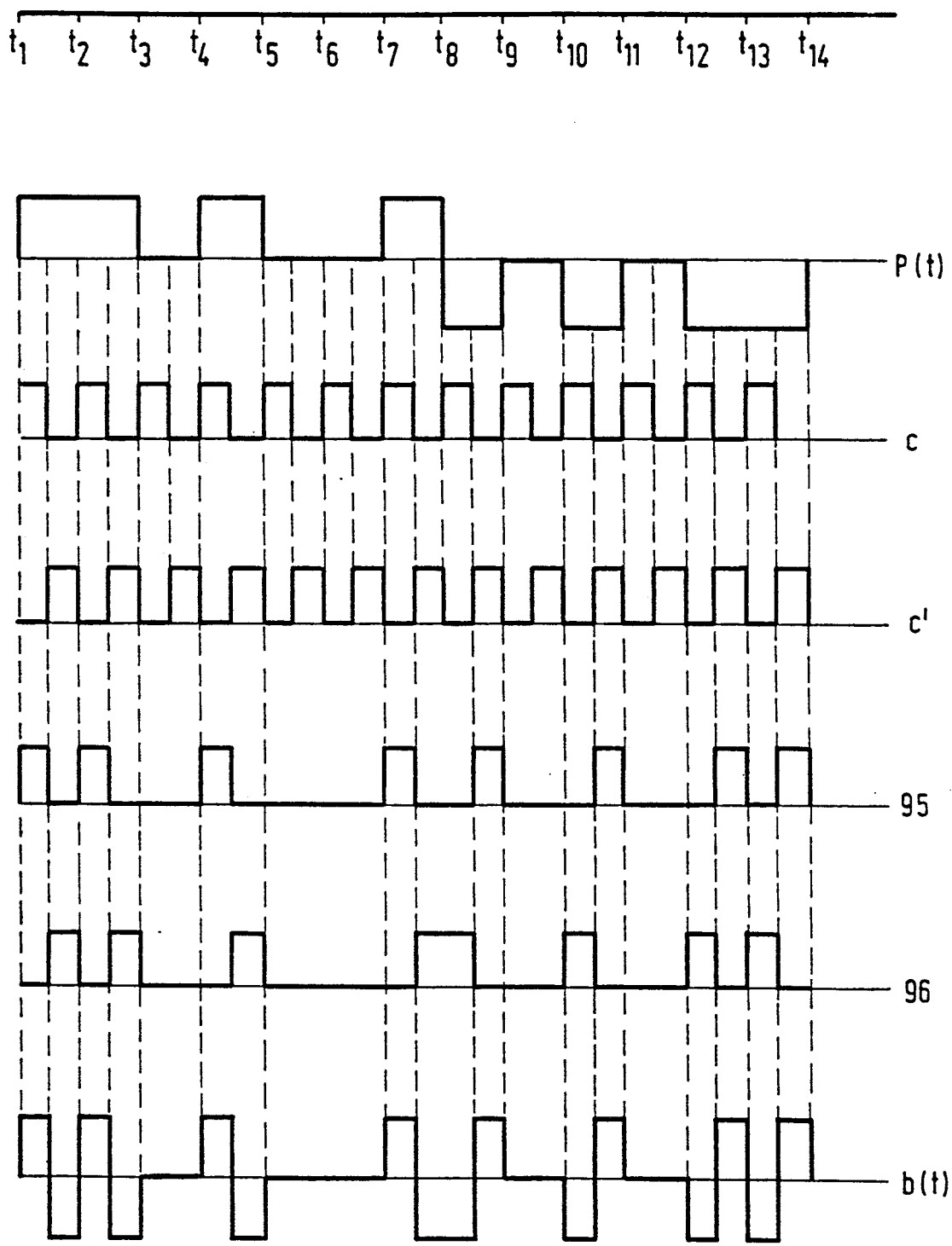
FIG. 4 shows the variation in time of various signals in a part of such an rf pulse.

The variation in time of the signals at the outputs 95 and 96 which occurs as a result of this variation of p (second line) is represented by the lines 5 and 6 of FIG. 4. The resultant signal b at the secondary winding of the transformer 83 is shown on the seventh line (in ideal form because the actual variation is not exactly rectangular). It appears that in the case of a positive pulse exactly one carrier oscillation is generated with a first phase position and that in the case of a negative pulse one carrier oscillation is generated with a phase position which has been shifted through 180° with respect thereto, and that no carrier oscillations are generated during the intervals between pulses. At the instant t8, at which the positive pulse changes over into a negative pulse, the phase is shifted through 180°.

The signal at the secondary winding of the transformer 83 not only contains components having the Larmor frequency but also higher frequency interference components which are caused by higher harmonics of the carrier signal or by the fact that the carrier oscillations are completely suppressed during the pulse intervals. These interference components do not directly have a disturbing effect per se on magnetic resonance imaging. However, they may be reflected by the rf coil tuned to the Larmor frequency, thus disturbing the transmitter stage. Therefore, these components are preferably eliminated by means of a filter which may be formed by the suitably proportioned transformer 83, possibly in conjunction with a capacitor connected parallel to the primary winding of this transformer.

The rf power applied to the rf coil via the transmitter stage 8 is a square law function of the supply voltage U, because the transmitter stage operates in the switching mode. Mains voltage fluctuations or other effects which become apparent as a fluctuation of the supply voltage, therefore, may have a negative effect on the magnetic resonance examination performed. The same holds good for the ripple superposed on the supply voltage. These disturbing effects can be eliminated or at least reduced by using a stabilised mains section. Such mains sections, however, must be designed for very high powers (from some hundreds of W to some kW) so that they are expensive.

Figure 5:
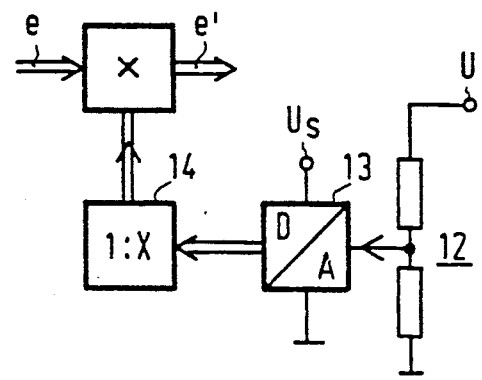
FIG. 5 shows a block diagram for relatively inexpensive voltage stabilizing.

FIG. 5 shows the block diagram of a less complex solution to this problem. The non-stabilised supply voltage U, exhibiting mains voltage fluctuations and ripple, is applied to an analog-to-digital converter 13 via a measuring voltage divider 12. The converter is connected to a stabilised supply voltage $U_S$. This necessitates the use of a stabilised supply voltage generator, but such a generator need be constructed for low powers only. The output signal of the analog-to-digital converter thus represents the instantaneous value of the nonstabilised supply voltage U. This digital output signal is applied to a circuit 14. The circuit 14 may comprise a look-up table memory in which for each input signal there is applied an output signal which is substantially proportional thereto and which is converted into a digital output signal which is at least approximately proportional to the reciprocal value of the input signal. Thus, this signal is proportional to 1/U. It is applied to one input of a digital multiplier, the other input of which receives the envelope signal e. Thus, a digital signal e' which is proportional to the supply voltage U is obtained on the output of the multiplier.

For example, when the supply voltage U increases, e' is proportionally smaller than e so that despite the higher energy contents of a single oscillation applied to the rf coil the rf power remains constant because of the reduced pulse density. Because the amplitude at the output of the transmitter stage is not exactly proportional to the supply voltage because of the inevitable voltage drops at the switches 81, 82, the output signal of the circuit 14 may be only approximately inversely proportional to the signal of the analog-to-digital converter 13.

However, it is alternatively possible to modify the other input signal (s2) in dependence of the output signal of the analog-to-digital converter 13 corresponding to the error sum signal F in accordance with the equation (6). To this end, the signal F should merely be multiplied by a factor which is approximately proportional to the output signal of the analog-to-digital converter 13.

The invention has been described with reference to an embodiment in which pulses are generated in the pulse density modulator which are capable of assuming two different digital values; in dependence thereof the carrier is switched on and off in two phase positions which have been shifted 180° with respect to one another. However, it is also possible to generate pulses which are capable of assuming k different digital values (where k is greater than 2) and to generate, in dependence thereof, for each pulse a carrier oscillation whose phase position deviates from the phase position for the other possible values of a pulse by 360°/k or an integer multiple thereof. Even though the circuitry required for the modulator 9 is thus increased, complex envelope signals (for k=4) could then also be processed, i.e. signals having a real and an imaginary component; this could be of use for generating single side band signals or for powering quadrature coils. The real and the imaginary components could then be separately processed in a modulator such as the modulator 9; in that case the real component of the envelope signal should be applied to one modulator and the imaginary component should be applied to the other modulator and the phase of the carrier signals applied to the second modulator should be shifted through 90° with respect to the signals applied to the first modulator. The output signals of the modulators should also be combined in a suitable manner, if necessary.

We claim:

1. A rf generator for magnetic resonance tomography apparatus, comprising a modulator in which a carrier is modulated with an amplitude of an envelope signal, and also comprising a transmitter stage which is connected subsequent to the modulator, characterized in that the modulator (9) comprises a first modulator section (91) in which the envelope signal (e) is converted into a series of equally long digital pulses (p) having values and density corresponding to the amplitude of the envelope signal, in that the first modulator section controls a second modulator section (92) so that the transmitter stage (8) operating in the switching mode supplies carrier oscillations only during the pulses, said carrier oscillations having a phase determined by the value of each pulse.

2. An rf generator as claimed in claim 1, characterized in that the pulses have only two different values, one of which is assigned to a positive polarity while the other is assigned to a negative polarity of the envelope signal, in that the carrier is generated with a first phase (c) and a second phase (c') which has been shifted through 180° with respect to the first phase, and in that the transmitter stage produces the carrier having the first phase for one of said different values of a pulse, and produces the carrier with the second phase for the other of said different values.

3. An rf generator as claimed in claim 1, characterized in that during a pulse the carrier performs exactly one or more complete oscillations, a spacing between two successive pulses amounting to mT where m is a positive integer.

4. An rf generator as claimed in claim 1, characterized in that the transmitter stage comprises a pushpull switching stage (81, 82).

5. An rf generator as claimed in claim 1, characterized in that it comprises a filter (83) which is connected to the output of the transmitter stage in order to reduce the higher harmonics of the carrier frequency.

6. An rf generator as claimed in claim 5, characterized in that the transmitter stage comprises an output transformer (83) which is proportioned so that it at least partly suppresses the higher harmonics of the carrier frequency.

7. An rf generator as claimed in claim 1, characterized in that the transmitter stage is connected to a non-stabilised supply voltage (U), in that there is provided an analog-to-digital converter which digitises a signal which is proportional to the supply voltage, and in that the pulse density is controlled in dependence on the output signal of the analog-to-digital converter so that the pulse density varies in the opposite sense with respect to the supply voltage.

8. An rf generator as claimed in claim 1, characterized in that the first modulator section comprises an accumulator circuit for forming a control signal (51) which depends on the difference (F) between the pulses and the envelope signal, the control signal being applied to a logic circuit (912) which generates a pulse having a positive or a negative polarity so that the integral remains within a given range.

9. An rf generator as claimed in claim 2, characterized in that during a pulse the carrier performs exactly one or more complete oscillations, a spacing between two successive pulses amounting to mT wherein m is a positive integer.

10. An rf generator as claimed in claim 2, characterized in that the transmitter stage comprises a pushpull switching stage (81, 82).

11. An rf generator as claimed in claim 9, characterized in that the transmitter stage comprises a pushpull switching stage (81, 82).

12. An rf generator as claimed in claim 2, characterized in that it comprises a filter (83) which is connected to the output of the transmitter stage in order to reduce the higher harmonics of the carrier frequency.

13. An rf generator as claimed in claim 11, characterized in that it comprises a filter (83) which is connected to the output of the transmitter stage in order to reduce the higher harmonics of the carrier frequency.

14. An rf generator as claimed in claim 12, characterized in that the transmitter stage comprises an output transmitter (83) which is proportioned so that it at least partly suppresses the higher harmonics of the carrier frequency.

15. An rf generator as claimed in claim 13, characterized in that the transmitter stage comprises an output transmitter (83) which is proportioned so that it at least partly suppresses the higher harmonics of the carrier frequency.

16. An rf generator as claimed in claim 2, characterized in that the transmitter stage is connected to a non-stabilized supply voltage (U), in that there is provided an analog-to-digital converter which digitises a signal which is proportional to the supply voltage, and in that the pulse density is controlled in dependence on the output signal of the analog-to-digital converter so that the pulse density varies in the opposite sense with respect to the supply voltage.

17. An rf generator as claimed in claim 15, characterized in that the transmitter stage is connected to a non-stabilized supply voltage (U), in that there is provided an analog-to-digital converter which digitises a signal which is proportional to the supply voltage, and in that the pulse density is controlled in dependence on the output signal of the analog-to-digital converter so that the pulse density varies in the opposite sense with respect to the supply voltage.

18. An rf generator as claimed in claim 2, characterized in that the first modulator section comprises an accumulator circuit for forming a control signal (51) which depends on the difference (F) between the pulses and the envelope signal, the control signal being applied to a logic circuit (912) which generators a pulse having a positive or a negative polarity so that the integral remains within a given range.

19. An rf generator as claimed in claim 17, characterized in that the first modulator section comprises an accumulator circuit for forming a control signal (51) which depends on the difference (F) between the pulses and the envelope signal, the control signal being applied to a logic circuit (912) which generators a pulse having a positive or a negative polarity so that the integral remains within a given range.

* * * * *